United States Patent
Kurrer et al.

(10) Patent No.: US 6,437,237 B1
(45) Date of Patent: Aug. 20, 2002

(54) SCREENING DEVICE HAVING A LOW OVERALL HEIGHT FOR ELECTROMAGNETICALLY SCREENED METAL HOUSING

(75) Inventors: Siegfried Kurrer, Nürnberg; Werner Körber, Betzenstein; Ernst Billenstein, Burgbernheim; Kurt-Michael Schaffer, Eckental, all of (DE)

(73) Assignee: Siemens AG, Munich (DE)

( * ) Notice: Subject to any disclaimer, the term of this patent is extended or adjusted under 35 U.S.C. 154(b) by 0 days.

(21) Appl. No.: 09/142,644

(22) PCT Filed: Mar. 4, 1997

(86) PCT No.: PCT/DE97/00394

§ 371 (c)(1),
(2), (4) Date: Jan. 26, 1999

(87) PCT Pub. No.: WO97/34457

PCT Pub. Date: Sep. 18, 1997

(30) Foreign Application Priority Data

Mar. 12, 1996 (DE) .................................... 296 04 600 U

(51) Int. Cl.⁷ ................................................ H05K 9/00
(52) U.S. Cl. .............................. 174/35 R; 174/35 GC; 361/816; 361/818
(58) Field of Search .................... 174/35 R, 35 GC; 361/816, 818, 753, 800; 439/65, 66

(56) References Cited

U.S. PATENT DOCUMENTS

| 4,514,023 A | * | 4/1985 | Rice | 339/17 CF |
|---|---|---|---|---|
| 4,884,171 A | * | 11/1989 | Maserang et al. | 361/424 |
| 5,383,098 A | * | 1/1995 | Ma et al. | 361/818 |
| 5,490,043 A | | 2/1996 | Tan et al. | 361/818 |
| 5,506,373 A | * | 4/1996 | Hoffman | 174/35 GC |
| 5,508,889 A | * | 4/1996 | Li | 361/816 |
| 5,687,470 A | * | 11/1997 | Halttunen et al. | 29/592.1 |
| 5,729,436 A | * | 3/1998 | Yoshigi et al. | 361/752 |
| 5,949,019 A | * | 9/1999 | Sirainen | 174/35 R |
| 5,952,608 A | * | 9/1999 | Kim | 174/35 GC |

FOREIGN PATENT DOCUMENTS

| DE | 36 04 860 | 8/1987 |
|---|---|---|
| DE | 41 10 800 | 7/1992 |
| DE | 41 30 355 | 9/1992 |
| EP | 0 629 111 | 12/1994 |

* cited by examiner

Primary Examiner—Dean A. Reichard
Assistant Examiner—W. David Walkenhorst
(74) Attorney, Agent, or Firm—Kenyon & Kenyon

(57) ABSTRACT

The present invention relates to a screening device having a base plate and at least one shaped strip which can be joined to a side edge of the base plate. In this case, a shaped strip can be designed as a contact shaped strip or as a spring shaped strip with a plugged-on contact socket connector, and can advantageously be joined respectively to opposite side edges of a base plate. The advantage of the screening device in accordance with the present invention is, in particular, the low height of the shaped strips and, resulting therefrom, the electromagnetic screening, extending virtually ideally in one plane, of the metal housing, in particular in the case of a plurality of screening devices arranged next to one another. With subracks, the screening device in accordance with the present invention can be used, for example, as a rear cover or as a front filler panel for unassigned module locations.

3 Claims, 3 Drawing Sheets

SCREENING DEVICE HAVING A LOW OVERALL HEIGHT FOR ELECTROMAGNETICALLY SCREENED METAL HOUSING

This application is a 371 of PCT/DE97/00394 Mar. 4, 1997.

BACKGROUND OF THE INVENTION

In order to be able to ensure interference-free functioning of electric circuits and the like, it is necessary to screen the latter against electromagnetic waves. For this purpose, the housing which surrounds the electric circuit must predominantly comprise metal housing parts. In this case, the screening prevents both penetration of electromagnetic waves and their escape from the housing. It is necessary for this purpose to establish between the metal housing parts continuously electrically conducting connections, in particular via contact spring elements. These connections must be as free from gaps as possible as a function of the level of the electromagnetic frequencies.

German application no. DE 36 04 860 A1 describes an arrangement for radio-frequency screening of the front plate of a withdrawable unit of a subrack. The front plate has a contact strip along one longitudinal side and, along the opposite longitudinal side, a retaining strip with an inserted sliding socket connector projecting beyond the edge of the front plate. In this arrangement, the front plate is designed in one piece with the contact strip and the retaining strip as an extruded section.

Because of the required inherent stability, the front plate must have an appropriate plate thickness. As a result, the minimum thickness and minimum height of contact strip and retaining strip are likewise prescribed. Because of the inwardly projecting contact and retaining strips, the printed circuit board fitted via a front connector on the rear of the front plate can be inserted only up to a minimum spacing in the direction of the front plate. Particularly in the case of printed circuit boards inserted in subracks, the insertion surface is, however, limited and cannot be extended at will. A problem in this case is the contact point between the sliding socket connector and a neighbouring contact strip, in which contact point is conditioned by the height of the sliding socket connector and is situated relatively deep in the housing. The regions of electric contact thereby displaced inwards cause a certain impairment of the electromagnetic screening of the housing. Electromagnetic waves can thus penetrate through the gaps between the front plates, and are absorbed by the contact strips and sliding socket connectors only relatively far behind the rear of the front plates. However, the further that electromagnetic waves penetrate into a housing, the greater is their possible interference potential.

SUMMARY OF THE INVENTION

It is an object of the present invention to specify a screening device for the electromagnetic screening of the housing which is more effective by contrast with conventional screening devices.

This object is achieved by means of a screening device for an electromagnetically screened metal housing, in particular for a subrack, having a base plate and at least one shaped strip which can be joined to a side edge of the base plate. The shaped strip has, furthermore, a strip-shaped contact limb, which is arranged approximately orthogonally relative to the plane of the base plate, and a strip-shaped bearing limb which can be joined to the base plate and is angled off in such a way as to make the shaped strip approximately flush with the front side of the base plate.

An advantage of the screening device according to the present invention is the low height of the separate shaped strips. The latter project only slightly into a printed circuit board fastened orthogonally, for example, on the rear of the screening device. This produces on the latter an optimum use of surface area for components.

It is particularly advantageous that in the case of two neighbouring screening devices the contact point between the spring shaped strip of the first screening device and the contact limb of the second screening device is situated virtually at the level of the rear of the base plates. This produces electrical contacts which extend virtually in one plane with the front side of the individual screening devices or other neighbouring housing parts and effects a virtually ideal electromagnetic screening of the housing.

A further advantage of the screening device in accordance with the present invention is the separately produced shaped strip, which can be designed as a spring shaped strip, for example. The separate production of a spring shaped strip permits, in particular, a finer working of the section, as such in the extrusion moulding process. It may then be possible to use a standard section and a standard spring shape for all contact socket connectors and shaped strips required in the electromagnetically screened housing. It is therefore advantageously possible, for example, to use only a single embodiment of a contact spring on a housing. In particular, it is possible to use a section shape onto which a contact socket connector can advantageously be plugged.

DETAILED DESCRIPTION

Figure 1:
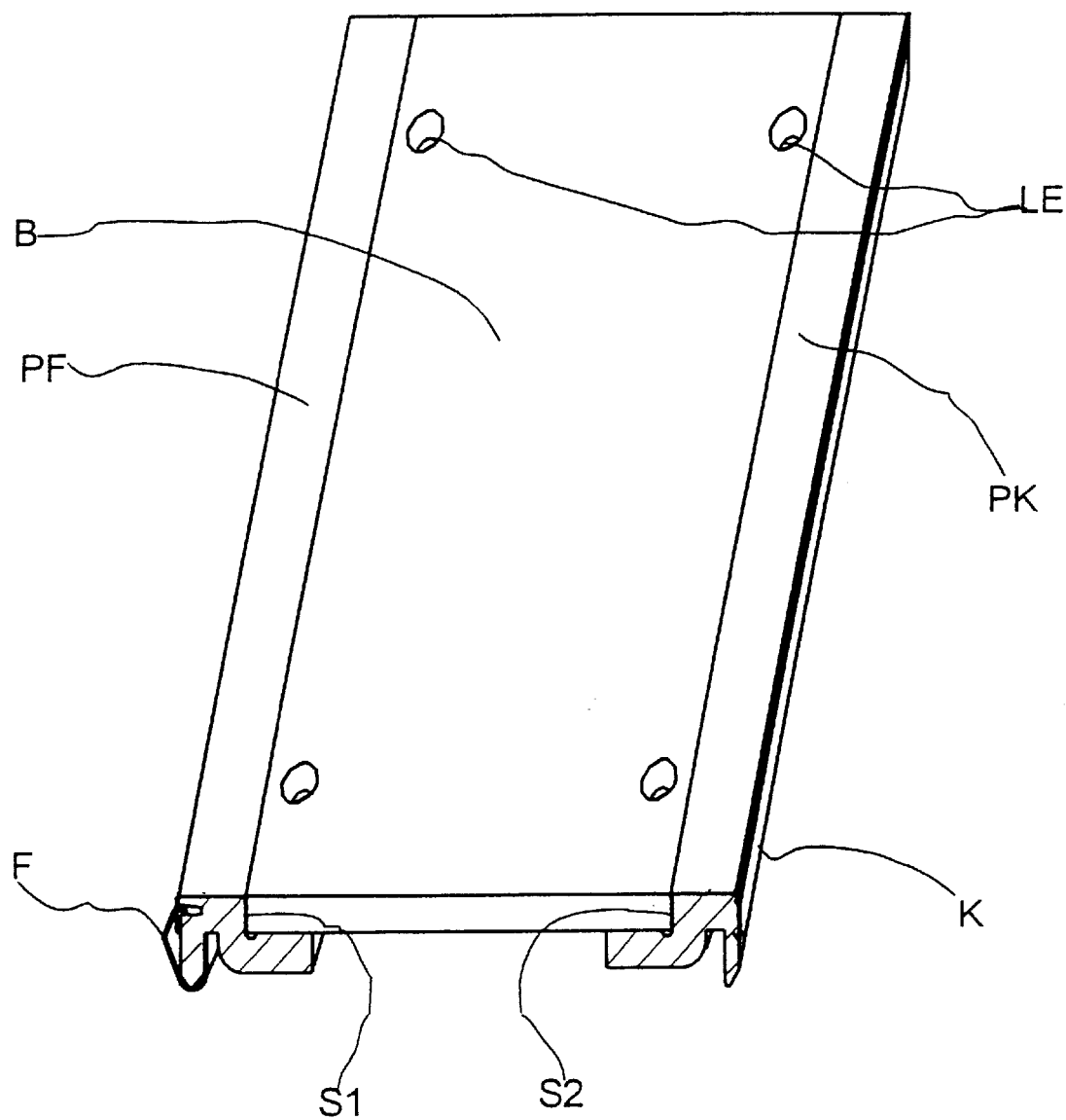
FIG. 1 shows, by way of example, a screening device in accordance with the present invention, having a base plate and two shaped strips joined at their side edges, one shaped strip being designed as a contact shaped strip and the other as a spring shaped strip.

FIG. 1 shows, by way of example, an embodiment of a screening device in accordance with the present invention, having a base plate B and two shaped strips PK and PF joined at respective side edges S1 and S2. Said shaped strips are joined to the base plate B, in particular, by screwing or riveting via bores LE. In this case, it is preferred for one shaped strip to be designed as a contact shaped strip PK, and for the other to be designed as a spring shaped strip PF with a plugged-on contact socket connector F.

The exemplary embodiment shown in FIG. 1, of the screening device according to the present invention is used for the purpose of continuous electromagnetic screening of, for example, a front side of a housing. The contact socket connector F of a first screening device is pressed onto the strip-shaped contact surface K of the contact shaped strip PK of a neighbouring, second screening device by flush, planar juxtaposition of a plurality of screening devices of such a type. This produces a conducting electric connection between the individual screening devices, which results in the electromagnetically screening effect.

Figure 2:
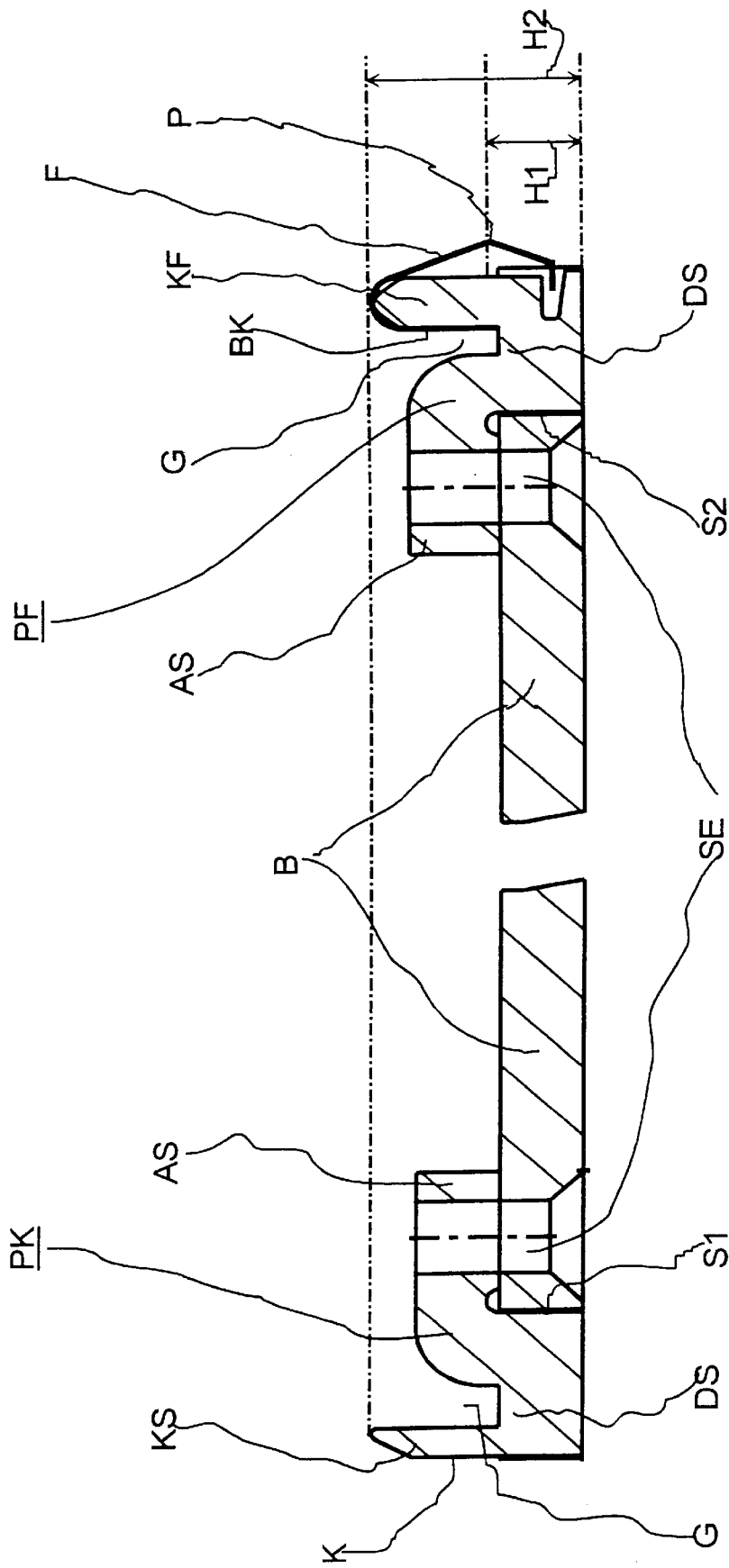
FIG. 2 shows, by way of example, a cross-section the screening device shown in FIG. 1

FIG. 2 shows a cross-section of the screening device according to the present, invention of an electromagnetically screened metal housing, shown by way of example in FIG. 1. In this case, said screening device has a base plate B and at least one shaped strip PK or PF, which is joined to one side edge S1 or S2 of the base plate B. The shaped strips PK and PF contain a strip-shaped contact limb KS or KF, which is arranged approximately orthogonally with respect to the plane of the base plate B, and each have, moreover, a strip-shaped bearing limb AS. The latter can be joined to the base plate B and angled off in such a way as to make the outside of the shaped strip PK or PF flush with the front side of the base plate B.

Moreover, in one embodiment of the screening device according to the present invention the shaped strip PK or PF between the contact limb KS or KF and the bearing limb AS can advantageously have a spacer limb DS terminating approximately flush with the front side of the base plate B. This produces a recess G on the rear of the shaped strip PK or PF between the contact limb KS or KF and bearing limb AS. Particularly in the case of the design of a shaped strip PF as a spring shaped strip, spring elements F, in particular a contact socket connector, can be plugged onto said strip, which are resiliently spread out to the side from the shaped strip PF. The recess G is advantageously used in this case, in particular, to hold a binding clip BK of the spring elements F which reaches downwards as far as possible and is situated opposite the spring limb.

The configuration according to the present invention of the screening device produces contact limbs KS and KF of particularly low height H2. The latter thus reduces to a minimum the space thereby required. The height H1 of the contact point P of the spring elements F advantageously approximately corresponds in the case of the screening device according to the invention to the thickness of the base plate B. The contact point P is thus generally at the level of the rear of the base plate B and thus bears resiliently and in an electrically conducting fashion against neighbouring housing parts. The result produces an electromagnetic screening of the housing which is approximately ideally continuous, indeed. In particular, this can be a neighbouring screening device having a shaped strip PK designed to give a contact shaped strip. In this case, the rearwardly directed strip-shaped contact limb KS has an external contact surface K which is used, in particular, as a mating contact surface relative to the spring elements F.

The screening device in the exemplary embodiment of FIG. 2 respectively has, by way of example, a shaped strip PK and PF on two opposite side edges S1 and S2 of the base plate B. The shaped strips PK and PF can be screwed, in particular via their bearing limbs AS, to the base plate B in the region of a side edge S1 or S2 respectively, by means of screws SE with countersunk heads.

Figure 3:
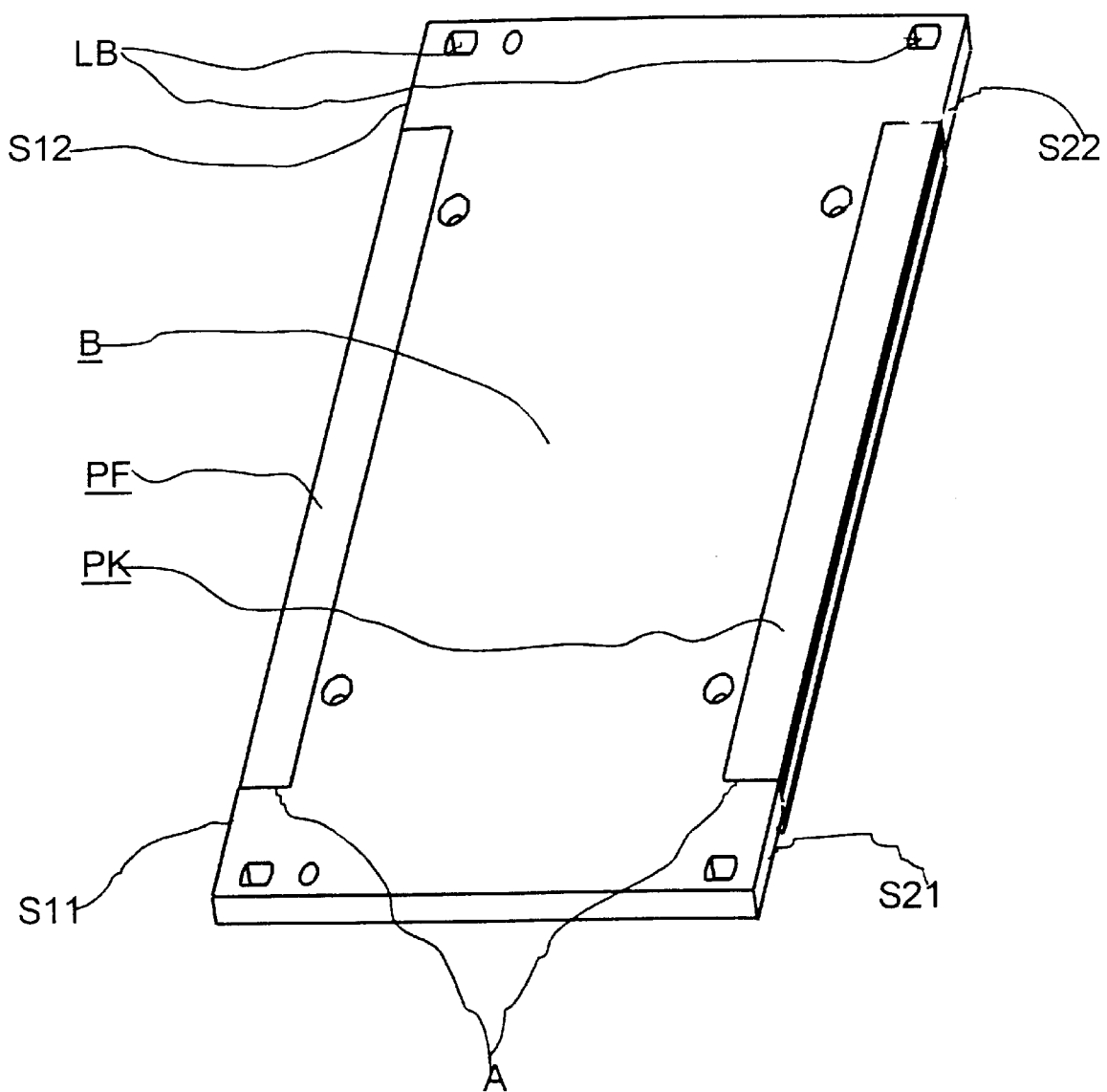
FIG. 3 shows, by way of example, a screening device in accordance with the present invention, having shaped strips inserted into two lateral recesses in the base plate.

Represented in FIG. 3 is a design variant of the screening device according to the present invention, which can be used with subracks, in particular. Here, the base plate B contains at least one lateral recess A in which a shaped strip PK or PF is inserted approximately flush with and parallel to the external side edges S11 and S12, or S21 and S22 of the base plate B. Shaped strips PK or PF projecting up to the corners of the base plate B are obstructive when it comes, for example, to fastening the screening device on upper and lower transverse and/or longitudinal sections of a subrack. The base plate B thus respectively has, for example, on the upper and lower side edges the plane surface without shaped sections PK and PF which is provided with bores LB in the case of fastening the screening device on a subrack by means of screwing.

In the case of subracks, in particular, an electromagnetic screening device according to the present invention, for example as a front plate, can also be used as a rear cover or as a front filler panel for unassigned module locations.

An advantage of the screening device according to the present invention is, in particular, the low height of the separate shaped strips PK and PF, and the electromagnetic screening, thereby extending ideally in a plane of the metal housing, in particular in the case of a plurality of screening devices arranged next to one another. The separate shaped strip PF designed as a spring shaped strip is advantageously designed such that only a single embodiment of a contact spring which can be plugged on simply has to be used with the housing.

What is claimed is:

1. A screening device for an electromagnetically screened metal housing, comprising:

a base plate extending along a first plane and having a side edge; and at least one shaped strip formed as a separate part with respect to the base plate, the at least one shaped strip being joined to the side edge of the base plate, the at least one shaped strip including:
      a strip-shaped contact limb arranged to project away from the front face of the base plate, and
      a strip-shaped bearing limb joined to the base plate and arranged at at least one of the at least one shaped strip;

wherein the base plate includes at least one lateral recessed portion and has outer edges, the at least one shaped strip being inserted into the at least one lateral recessed portion so that the at least one shaped strip is flush with and parallel to the outer edges of the base plate.

2. A screening device for an electromagnetically screened metal housing, comprising:

a base plate extending along a first plane and having a side edge; and at least one shaped strip formed as a separate part with respect to the base plate, the at least one shaped strip being joined to the side edge of the base plate, the at least one shaped strip including:
      a strip-shaped contact limb arranged to project away from the front face of the base plate, and
      a strip-shaped bearing limb joined to the base plate and arranged at at least one of the at least one shaped strip;

a spring element plugging onto the strip-shaped contact limb of the at least one shaped strip and resiliently spreading out sideways from the at least one shaped strip.

3. The screening device according to claim 2, wherein the spring element includes a contact socket connector.

* * * * *